United States Patent [19]

Vu et al.

[11] Patent Number: 5,583,739
[45] Date of Patent: Dec. 10, 1996

[54] CAPACITOR FABRICATED ON A SUBSTRATE CONTAINING ELECTRONIC CIRCUITRY

[75] Inventors: Quat T. Vu, Santa Clara; Donald S. Gardner, Mountain View, both of Calif.

[73] Assignee: Intel Corporation, Santa Clara, Calif.

[21] Appl. No.: 515,249

[22] Filed: Aug. 15, 1995

Related U.S. Application Data

[62] Division of Ser. No. 93,046, Jul. 15, 1993, Pat. No. 5,472,900, which is a continuation of Ser. No. 815,234, Dec. 31, 1991, Pat. No. 5,285,017.

[51] Int. Cl.$^6$ .................................................... H01G 4/20
[52] U.S. Cl. ........................................... 361/313; 361/312
[58] Field of Search ........................ 361/311–313, 321.1, 361/321.2, 321.3, 321.4, 321.5, 321.6; 257/295, 306–309

[56] References Cited

U.S. PATENT DOCUMENTS

| | | |
|---|---|---|
| 4,023,197 | 5/1977 | Magdo et al. . |
| 4,471,405 | 9/1984 | Howard et al. ..................... 361/305 |
| 4,628,406 | 12/1989 | Smith et al. . |
| 4,803,450 | 2/1989 | Burgess et al. . |
| 4,931,411 | 6/1990 | Tigelaar et al. . |
| 5,006,481 | 4/1991 | Chan et al. . |
| 5,056,216 | 10/1991 | Madou et al. . |
| 5,079,670 | 1/1992 | Tigelaar et al. . |
| 5,104,822 | 4/1992 | Butler . |
| 5,126,794 | 6/1992 | Altmann . |
| 5,139,971 | 8/1992 | Giridhar et al. . |
| 5,165,166 | 11/1992 | Carey . |
| 5,210,379 | 5/1993 | Okonogi et al. . |
| 5,262,596 | 11/1993 | Kawakami et al. . |
| 5,262,662 | 11/1993 | Gonzalez et al. ..................... 257/307 |
| 5,308,929 | 5/1994 | Tani et al. . |

OTHER PUBLICATIONS

Hartmut Roskos, Martin C. Nuss, Keith W. Goossen, David W. Kisher, Alice E. White, Ken T. Short, Dale C. Jacobson, & John M. Poate, "Propagation of Picosecond Electrical Pulses on a Silicon–Based Microstrip Line With Buried Cobalt Silicide Ground Plane", Appl. Phys. Lett 58(23), 10 Jun. 1991. pp. 2604–2606.

*Primary Examiner*—Bot L. Ledynh
*Attorney, Agent, or Firm*—Blakely, Sokoloff, Taylor & Zafman

[57] ABSTRACT

An on-chip decoupling capacitor is disclosed. The capacitor of the present invention is fabricated using an embedded conductive layered structure. A first insulative layer, a first conductive layer, a second insulative layer, a second conductive layer, and a third insulative layer are deposited sequentially on a substrate having electronic circuitry. Next, a patterning layer is formed to provide for vias for interconnection between metal layers above and below the capacitor plates. An etch is then performed to form a via through the first, second and third insulative layers and the first and second conductive layers. Next, a fourth insulative layer is deposited and anisotropically etched to form sidewall insulators on the vias. Finally, interconnection between lower level metal levels and upper level metal levels is made through the vias. Additionally, methods of coupling the upper and lower capacitor plates to either power or ground are described.

24 Claims, 7 Drawing Sheets

CAPACITOR FABRICATED ON A SUBSTRATE CONTAINING ELECTRONIC CIRCUITRY

This is a divisional of application Ser. No. 08/093,046, filed Jul. 15, 1993, now U.S. Pat. No. 5,472,901 which is a continuation of application Ser. No. 07/815,234, filed Dec. 31, 1991, now U.S. Pat. No. 5,285,017, which application is assigned to the assignee of the present application. This application is related to U.S. patent application Ser. No. 07/815,234, now U.S. Pat. No. 5,285,017 filed concurrently, by Donald S. Gardner entitled "Embedded Ground Plane and Shielding Structures Using Sidewall Insulators in High Frequency Circuits Having Vias," which Application is hereby incorporated by reference.

BACKGROUND OF THE INVENTION

1. Field of the Invention

The present invention relates to electronic circuits, and more particularly relates to an on-chip decoupling capacitor.

2. Background Information

Electronic circuits, and particularly computer and instrumentation circuits, have in recent years become increasingly powerful and fast. As circuit frequencies exceeds several hundred megahertz (MHz), with the associated spectral components exceeding 10 gigahertz (GHz), noise in the DC power and ground lines increasingly becomes a problem. This noise can arise due to, for example, inductive and capacitive parasitics, as is well known. To reduce this noise, capacitors, known as decoupling capacitors are often used to provide a stable supply of power to the circuitry. The decoupling capacitors are placed as close to the load as practical to increase their effectiveness. Typically the decoupling capacitors are placed in the same package as the chip, but unfortunately, this arrangement is costly to manufacture. Typically, one or more capacitors having a low capacitance value are needed to reduce the effect of high frequency, low amplitude noise, while one or more capacitors having a high capacitance value are needed to reduce low frequency, high amplitude noise.

As mentioned above, the closer the capacitor is to the load, for example, the circuits on an integrated circuit chip, the more effective it is in eliminating or reducing the noise in the power and ground lines. Ideally, the most effective solution would be to fabricate a capacitor directly on, for example, the chip itself. However, such a capacitor would be costly to manufacture using prior art methodologies. In particular, a typical processing sequence would require a deposition, patterning, and etch of a first dielectric layer, to isolate underlying metal layers from the capacitor. Following the first dielectric layer, the lower plate of the capacitor could be formed by depositing, patterning and etching a first metal layer. Then, the interplate dielectric could be formed by depositing, patterning and etching a second dielectric layer. Next, a second metal layer forming the second plate of the capacitor could be deposited, patterned and etched followed by a final dielectric layer deposition, patterning and etch to isolate the capacitor. The various patterning and etch steps are needed in order to connect one plate of the capacitor to power and the other to ground, as well as to provide vias for interconnection from one or more metal layers below the capacitor to one or more metal layers above the capacitor. Unfortunately, the above described processing requires at least four patterning steps, which, as is well known, is very costly.

What is needed is a manufacturable method and structure for producing a decoupling capacitor directly on the substrate containing the circuitry to which the power is supplied.

SUMMARY OF THE INVENTION

A decoupling capacitor is disclosed. The capacitor of the present invention is typically formed on a substrate having underlying circuitry or device layers. The first plate of the capacitor is deposited on a dielectric layer and comprises a conductive material such as a metal. Next, a thin insulative layer having a high dielectric constant is deposited, followed by a second conductive layer forming the upper plate of the capacitor. Finally, another insulative layer is deposited on the upper capacitor plate.

In one embodiment of the present invention, a single masking layer is used to pattern vias extending through all insulative and conductive layers. A blanket dielectric layer is then deposited and anisotropically etched to form a sidewall insulator for the vias. Next, a metal layer is deposited to provide interconnection between metal layers beneath the capacitor and upper level metal layers. In this way, no additional masking steps are required to form the capacitor. In some embodiments, one to two masking steps are added to the process to provide for connection of the plates of the capacitor to power and ground. In another embodiment of the present invention, a preexisting level of interconnections consisting solely of power lines or a power plane is used as one plate of the capacitor.

Additional features and benefits of the present invention will become apparent from the detailed description, figures, and claims set forth below.

DETAILED DESCRIPTION OF THE INVENTION

A decoupling capacitor having insulated vias, and methods for fabricating the same, are disclosed. In the following detailed specification, numerous specific details are set forth, such as materials, thicknesses, processing sequences, etc., in order to provide a thorough understanding of the present invention. It will, however, be obvious to one skilled in the art that the present invention may be practiced without these specific details. In other instances, well known processing steps and device structures have not been described in detail in order to avoid unnecessarily obscuring the present invention. Furthermore, although the present invention is described below as being fabricated, for example, in a VLSI or ULSI integrated circuit chip, one skilled in the art would readily understand that the present invention could be embodied within, for example, multi-chip modules (MCM), circuit boards, or other structures that require a capacitor in close proximity to, for example, circuitry.

Figure 1A:
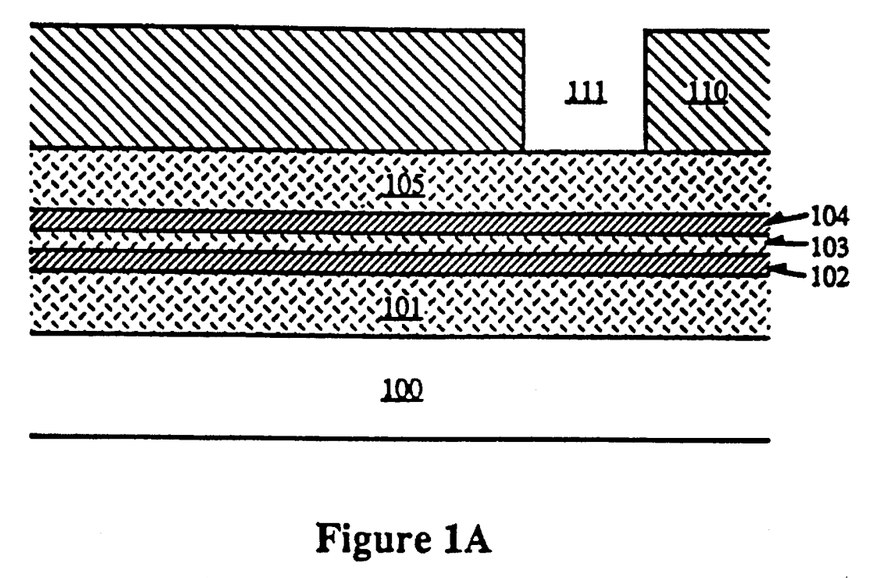
FIGS. 1A–1E illustrate the fabrication of an on-substrate capacitor according to a preferred embodiment of the present invention.
Figure 1B:
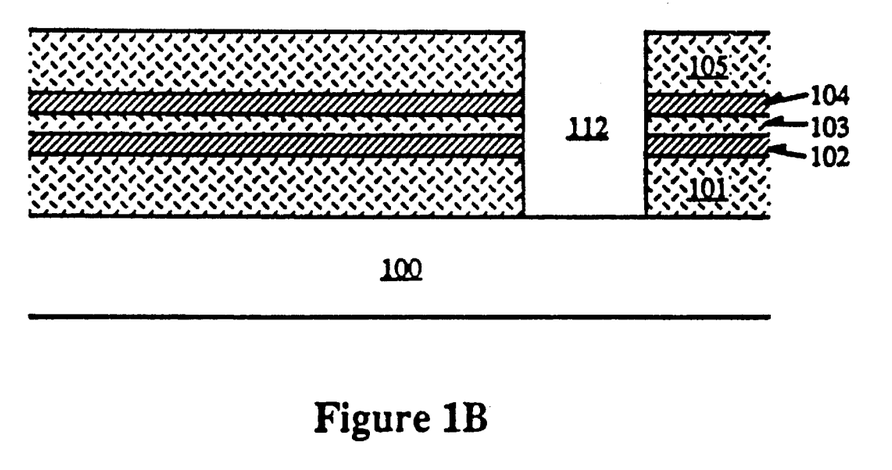

Referring now to FIG. 1A, a cross-sectional elevation view of a preferred embodiment of the present invention is shown. Substrate 100 could be, for example, a semiconductor wafer having, for example, device regions such as diffused junctions, other structures such as gates, local interconnects, metal layers, or other device structures or layers. In many cases, depending upon the device being fabricated, device layers or structures, or processing steps used to fabricate the device, which are present for reasons other than or in addition to structures or steps needed to fabricate the capacitor of the present invention, may be used in the fabrication of the capacitor of the present invention. Generally, these structures or steps will be referred to as "preexisting" structures or steps. Use of this terminology is not meant to imply that the structure or step is known in the prior art; rather, this terminology is used to note that the structure or step may otherwise be required in the fabrication of the device outside of its use in fabricating the capacitor.

In the present invention, dielectric layer 101 is deposited over substrate 100. Dielectric layer 101 typically has a thickness in the range of approximately 0.1–1.0 µm. Layer 101 could be, for example, silicon dioxide ($SiO_2$) either doped or undoped, silicon nitride ($Si_3N_4$), or silicon oxynitride ($SiO_xN_y$). Insulative layer 101 could be a preexisting layer. The thickness and material of layer 101 is not critical, so long as layer 101 provides electrical isolation between any previous conductive layers in substrate 100 and conductive layer 102, which is next deposited on insulative layer 1 01. Conductive layer 102 forms the lower plate of the capacitor and will alternatively be referred to as plate 102 herein. In a currently preferred embodiment, conductive layer 102 comprises a metal such as aluminum, tungsten or one or more other similar materials. The choice of materials may depend on other processing considerations. For example, if the substrate will be subjected to temperatures of approximately 660° C. or above, aluminum cannot be used since this is above its melting point. In a currently preferred embodiment, layer 102 is deposited to a thickness in the range of approximately 0.05–1.0µm. As discussed above, a preexisting layer such as a metallization layer may be used to form plate 102 so that the thickness and material of plate 102 may be dictated by other processing or device considerations.

Following deposition of conductive layer 102, insulative layer 103 is deposited on conductive layer 102. In a currently preferred embodiment, insulative layer 103 comprises undoped $SiO_2$ and is in the range of approximately 0.01–1.0 µm thick. As is well known, the capacitance between the plates of a capacitor is proportional to the dielectric constant of the dielectric between the plates, and inversely proportional to the separation between the plates. Therefore, layer 103 is made as thin as is practical and is preferably composed of a material having a high dielectric constant. Also as is well known, the capacitance is proportional to the area of the plates of the capacitor. Therefore, a desired capacitance of the decoupling capacitor can be achieved by adjusting any or all of the area of the plates, separation of the plates, and dielectric constant of the material between the plates, depending upon process and device requirements.

Conductive layer 104, which forms the upper plate of the capacitor of the present invention is next deposited on insulative layer 103. As with conductive layer 102, the thickness and material of layer 104 may vary. In a currently preferred embodiment, layer 104 comprises a metal such as, for example, aluminum or tungsten and is deposited to a thickness in the range of approximately 0.05–1.0 µm. Finally, insulative layer 105 is deposited on conductive layer 104. Insulative layer 105 can be made from the same materials as insulative layer 101. In a currently preferred embodiment, insulative layer 105 is deposited to a thickness in the range of approximately 0.1–1.0 µm.

Note that the capacitor plates 102 and 104 of the present invention are completely embedded within dielectric layers 101 and 105. The entire structure (layers 101 through 105) can in essence take the place of any preexisting insulative layer, such as an interlevel dielectric (ILD), even if further connection is required, for example, from metal layers above to metal layers beneath the capacitor, as will be shown below. Alternatively, as with the conductive layers 102 and 104, a preexisting dielectric layer may be used to form, for example, any of the insulative layers 101,103 and 105. Typically, the capacitor of the present invention will be formed near the end of the microchip process, and the exact location of the capacitor will depend upon the particular device being fabricated.

Figure 1C:
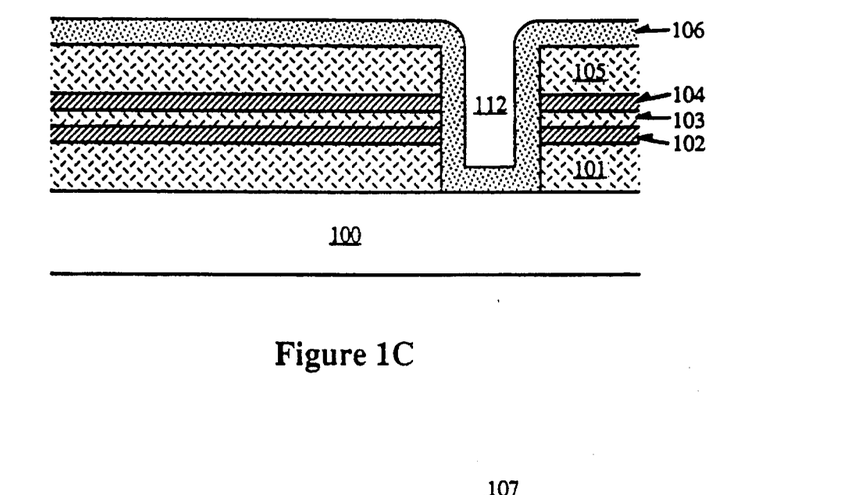
Figure 1D:
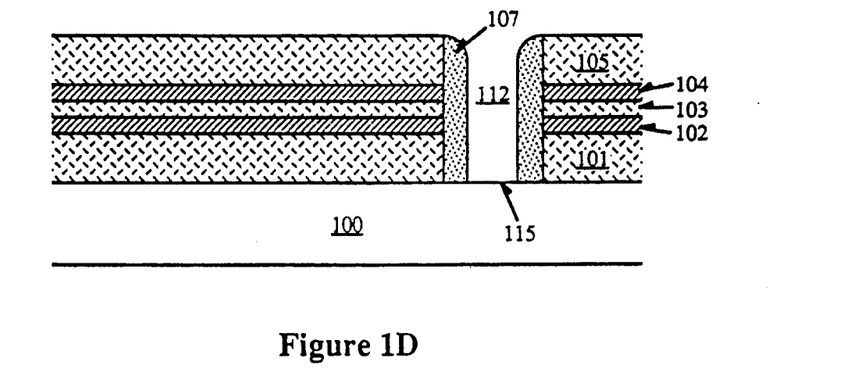

The fabrication of an isolated via through the capacitor of the present invention is illustrated in FIGS. 1A through 1E. First photoresist layer 110 having opening 111 therein is formed by well known methods on insulative layer 105. Next, a sequential etch is performed first through layer 105, then through layer 104, 103, 102 and finally layer 101. The etches of layers 101 through 105 is carried out using the single masking layer 110. While each layer may require a different etching process, the etching of all of layers 101 through 105 often can be performed in a single etch system with differing etch parameters and chemistries, for example, optimized to etch the material exposed. In some instances, a single etchant may be able to etch all layers. For example, if layers 102 and 104 are tungsten and layers 101,103, and 105 comprise $SiO_2$, an etch with a fluorine based chemistry can etch all layers. After etch, the structure is as shown in FIG. 1 B, with via 112 formed through layers 101–105. In the art, openings which expose silicon contact regions such as sources and drains in MOS devices, and collectors, bases, and emitters in bipolar devices are generally referred to as "contact openings," while openings which expose other structures such as an underlying metal layer are generally referred to as "vias." In describing the structures herein, any of the terms "via," "contact opening," or simply "opening" may be used to describe a particular opening to indicate that it may be of the type referred to. However, it will be understood that the described opening could be a via or a contact opening depending upon the underlying layer which is exposed for subsequent contacting, and use of a particular term in the detailed description is not meant to limit the structure to the more restrictive definition of that term described above. Next, as shown in FIG. 1C, insulative layer 106 is deposited on insulative layer 105 and on the sides and bottom of via 112. Following deposition of insulative layer 106, an anisotropic etch is carried out which etches insulative layer 106 from all horizontal surfaces. Insulative layer 106 will therefore be removed from the upper surface of insulative layer 105, and the bottom of via 112, but not from the sidewalls of via 112. After the anisotropic etch, the structure appears as shown in FIG. 1D, with sidewall insulator 107 formed on the sidewalls of via 112. Via 112 exposes region 115 of substrate 100. Region 115 could be, for example, a previous metal layer or a device region that must be connected to an upper level conductive layer. It will be appreciated that there will be many such vias 112 in each location where it is necessary to couple an upper level with the above-described or similar portions of the substrate. If desired, a hard mask layer such as $Si_3N_4$ or Al can be deposited on insulative layer 105 prior to patterning layer 110, which will provide a more robust mask for the etch through layers 101–105.

Figure 1E:
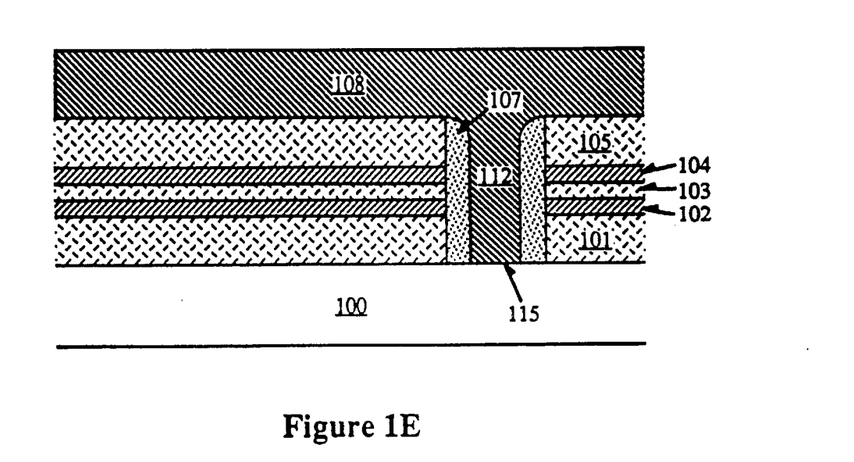

Following formation of via 112, conductive layer 108 is deposited in via 112 and on the surface of insulative layer 105. Conductive layer 108, could be, for example, an interconnection layer. Conductive layer 108 is then patterned using well known methods. As an alternative to using conductive layer 108 to fill via 112, via 112 can be filled with a conductive material in a separate process, to form a plug which electrically couples region 115 to a subsequently deposited conductive layer. The process to fill via 112 could be a selective deposition of, for example, tungsten, or doped polysilicon, or a blanket deposition and etchback of tungsten or other conductive materials. After the via fill in the alternative embodiment, conductive layer 108 is deposited on the surface of insulative layer 105 and on the via plug, and is patterned as before.

As described above, layers 101–105 may be located within the device in the same position as a preexisting dielectric layer. Therefore, any vias 112 can be formed in the same point in the process as a via etch of a device structure without a capacitor, with no increase in masking steps, with only the addition of the process shown in FIGS. 1C and 1D for forming sidewall insulator 107. Connection of one of the capacitor plates to ground, and the other to a power supply, may, but ideally should not require additional processing as will be described below.

Figure 2:
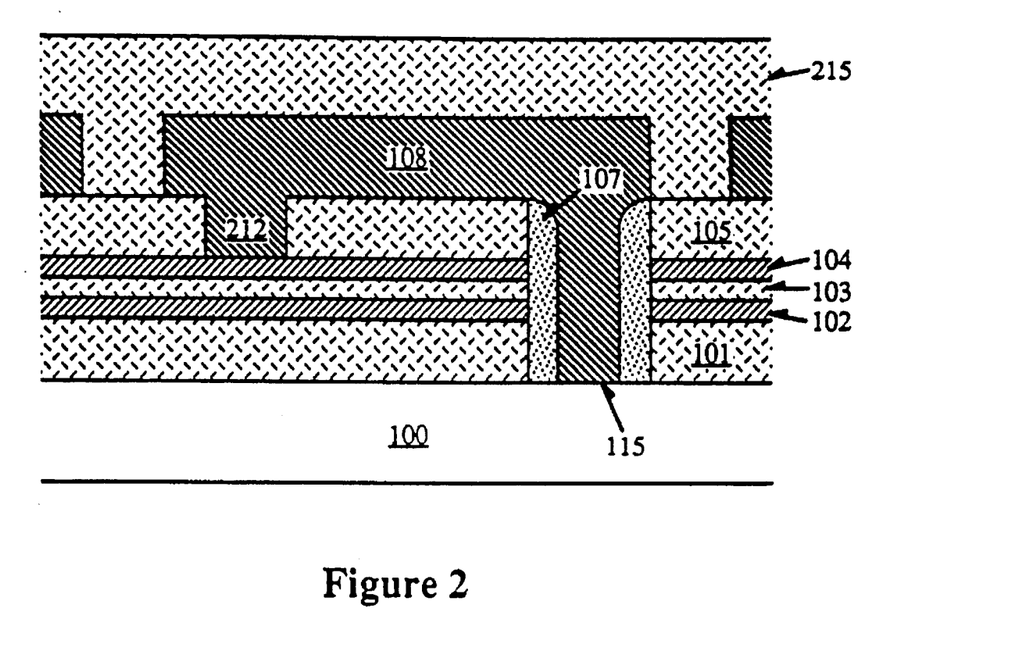
FIG. 2 shows one method of coupling the upper capacitor plate to an underlying conductive level.

Referring to FIG. 2, connection of the upper capacitor plate 104 using interconnection layer 108 is shown. Interconnection layer 108, as described above contacts substrate 100 in region 115, which in this case could be a previous metal layer, for example. The previous metal layer can be connected to either power or ground. To form the connection to ground or power as shown in FIG. 2, the structure of FIG. 1D is patterned, followed by an etch of layer 105 to form the via 212 of FIG. 2. Next, layer 108 is deposited, patterned and etched to form the connection shown. The masking step to form via 112 may be in addition to normal processing, or may be done as a part of normal processing, for example processing for via formation of subsequent levels of interconnections, depending upon the specific process sequence. The masking, patterning and etch of layer 108 is typically done concurrently with, for example, preexisting interconnection processing. Finally, dielectric layer 215 is deposited as shown. Dielectric layer 21 5 could be, for example, an interlevel insulator or a passivation layer.

Figure 3A:
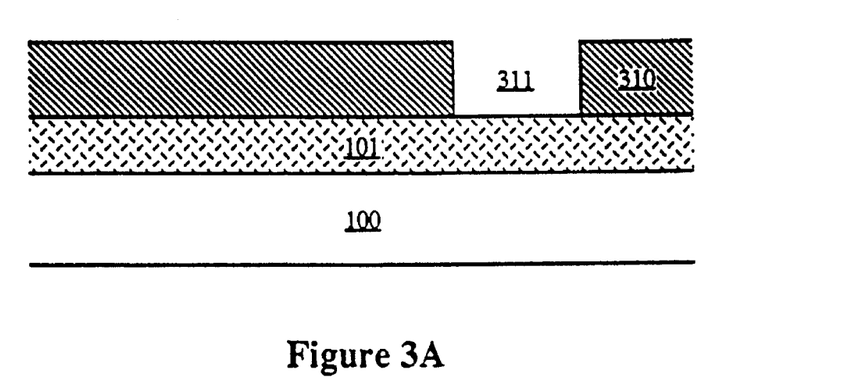
FIGS. 3A–3C show one method for coupling the lower capacitor plate to an underlying conductive layer.
Figure 3B:
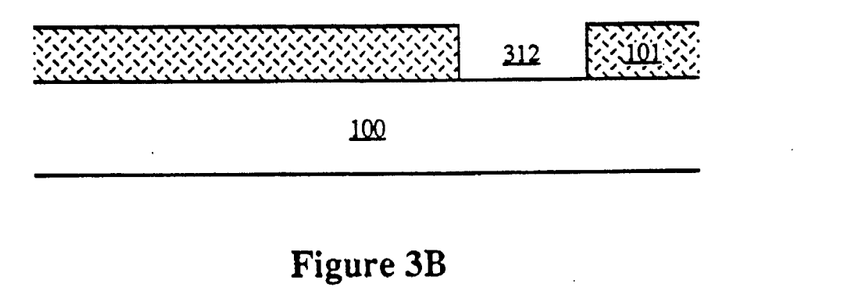
Figure 3C:
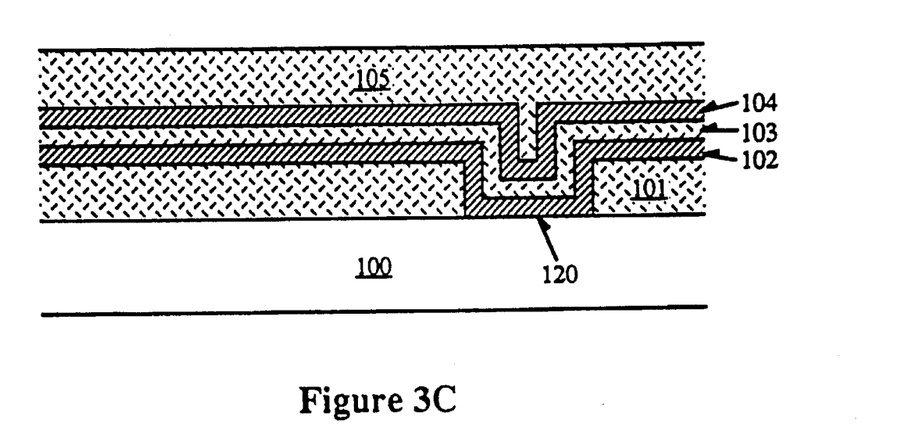

Referring to FIGS. 3A through 3C, a method for coupling the lower plate to power or ground is shown. First, as shown in FIG. 3A, after deposition of layer 101, patterning layer 310 with opening 311 is formed thereon. Next, layer 101 is etched in the region exposed by opening 311, to form via 312. Following removal of patterning layer 310, the structure appears as shown in FIG. 3B. Next, layers 102, 103, 104 and 105 are deposited as described above. The resulting structure is shown in Figure 3C. As can be seen, layer 102 is deposited in via 31 2 and is therefore in contact with substrate 100 in the region 120 which could be, for example, a previous metal layer coupled to either power or ground. Use of the technique shown in FIGS. 3A through 3C requires the additional masking step shown in FIG. 3A. If a device has both power and ground metallization below the capacitor, then either or both of the methods shown in FIGS. 2 and 3C can be used to connect the capacitor to both power and ground. Alternatively, either or both plates can be coupled to power or ground metallization disposed above the capacitor by formation of vias through the appropriate layers of the capacitor to expose a portion of a plate for subsequent coupling to the overlying metallization. One such method is shown in FIGS. 5A–B, described later.

Figure 4A:
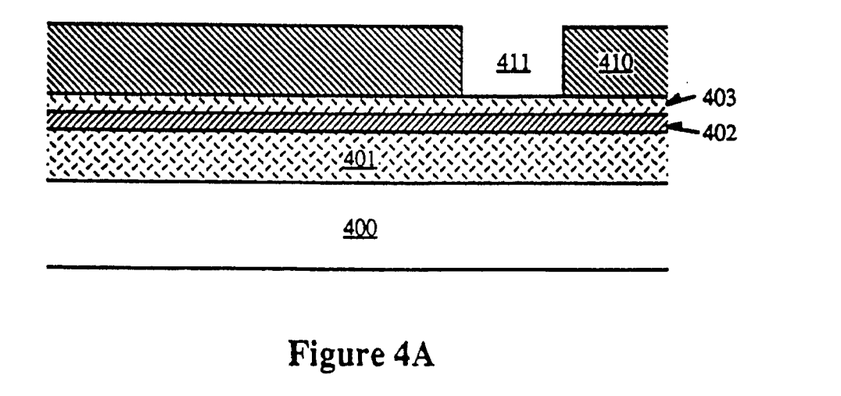
FIGS. 4A–4E illustrate fabrication of an on-substrate capacitor according to the present invention utilizing a conductive level for power distribution as one plate of the capacitor.

In the present invention, one or more of the capacitor plates 102 or 104 can be fabricated from layers used for other purposes. For example, either of these capacitor plates may be made from a metal layer used for interconnections. Alternatively, one of the capacitor plates can be formed from a conductive level used for power distribution such as a metal level consisting primarily of power or ground lines or a previously existing power or ground plane. FIGS. 4A through 4E show the fabrication of the capacitor of the present invention using a preexisting power distribution level as the upper capacitor plate. FIG. 4A shows substrate 400, having insulative layer 401, lower capacitor plate 402, and insulative layer 403 thereon. Substrate 400, and layers 401 through 403 are similar to substrate 100, and layers 101 through 103 of FIG. 1, respectively. As with layer 103, insulative layer 403 is preferably a thin layer, made of material having a high dielectric constant.

Figure 4B:
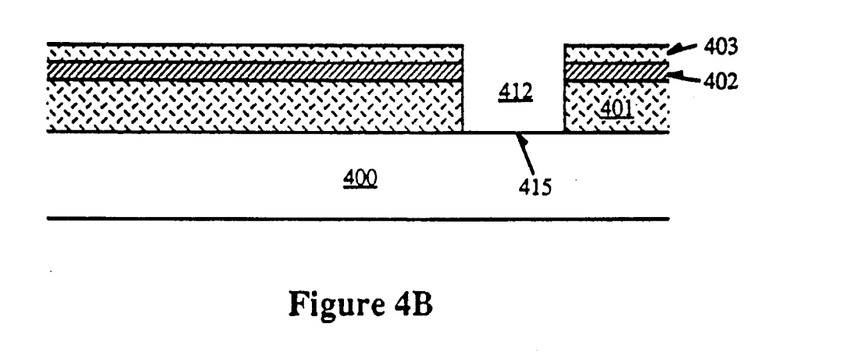
Figure 4C:
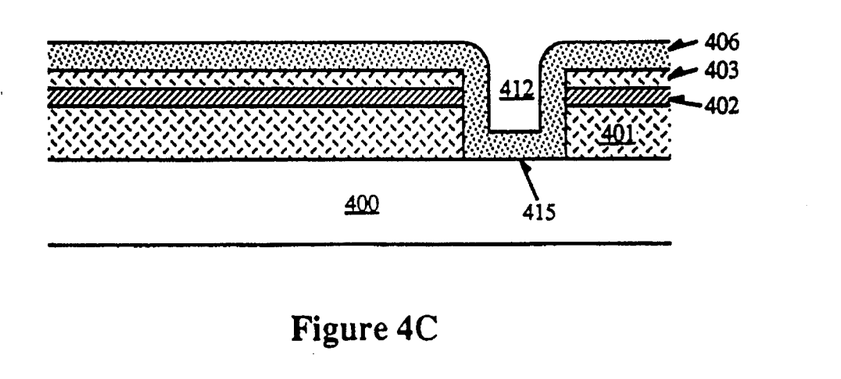
Figure 4D:
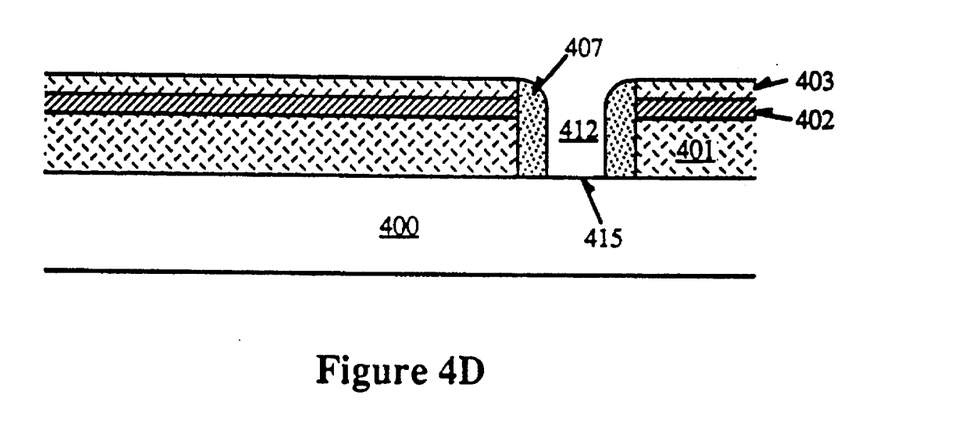
Figure 4E:
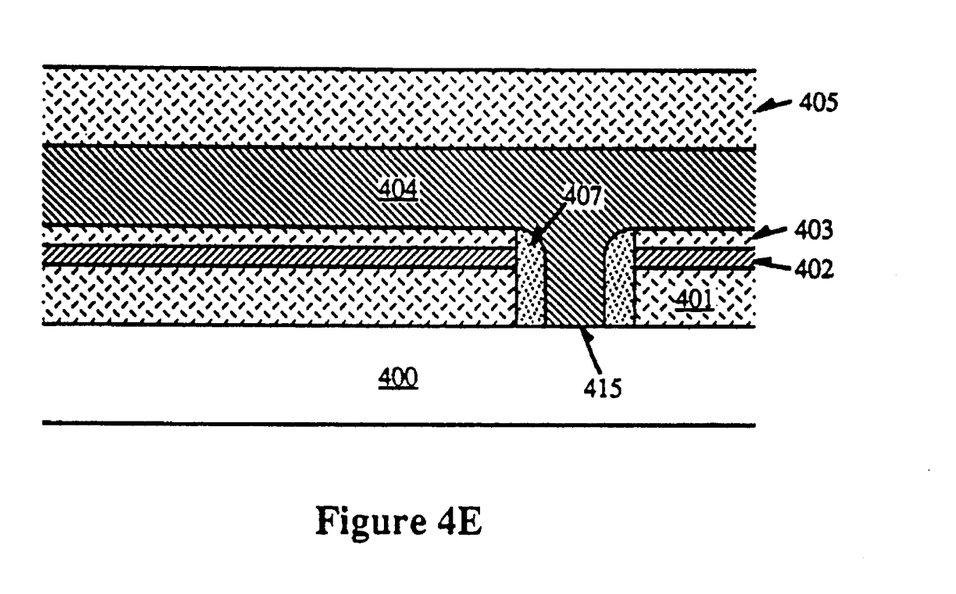

After deposition of insulative layer 403, which serves as a dielectric between the capacitor plates, patterning layer 410, with opening 411 therein is formed as shown. Next, an etch through layers 401 through 403 is performed, similar to the previously described etches, to form via 412 to expose substrate 400 in the region 415 as shown. Region 415 could be, for example, a previous metal layer. Next, as shown in FIG. 4C, insulative layer 406 is deposited on insulative layer 403 and in via 412. Next, an anisotropic etch is performed, resulting in a structure shown in FIG. 4D having sidewall insulator 407. Next, power distribution level 404, which serves as the upper plate of the capacitor, is deposited on insulative layer 403 and in via 412. In a currently preferred embodiment, power distribution level 404 is deposited to a thickness in the range of approximately 0.2–2.0 μm and comprises a conductive material such as an aluminum alloy or tungsten. Alternatively, a separate via fill process, as described above in regard to filling via 112, could be used to fill via 412 prior to deposition of power distribution level 404. Next, insulative layer 405 is deposited on power distribution level 404.

Figure 5A:
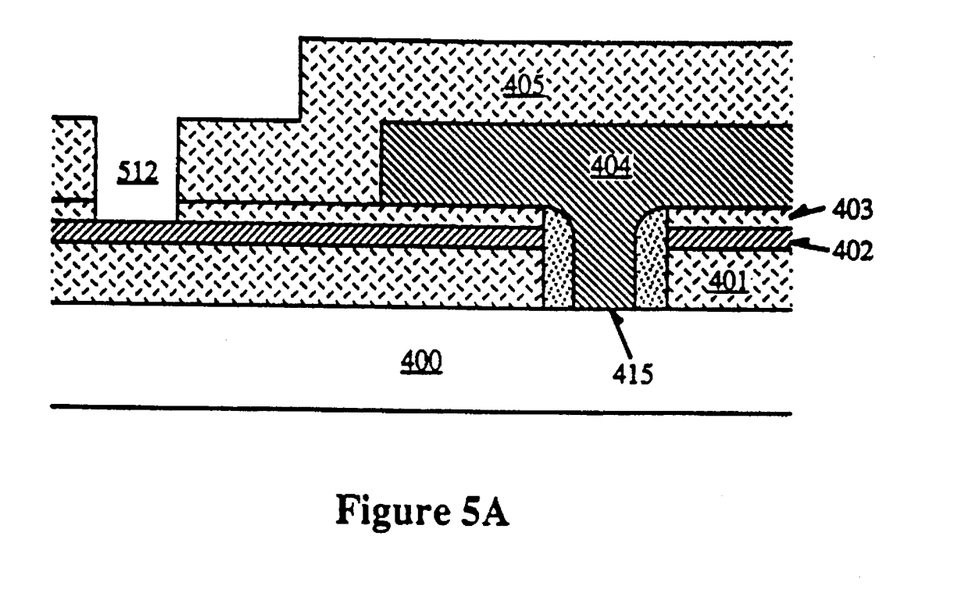
FIGS. 5A and 5B illustrate one method of coupling the lower plate of the capacitor of FIG. 4 to ground.
Figure 5B:
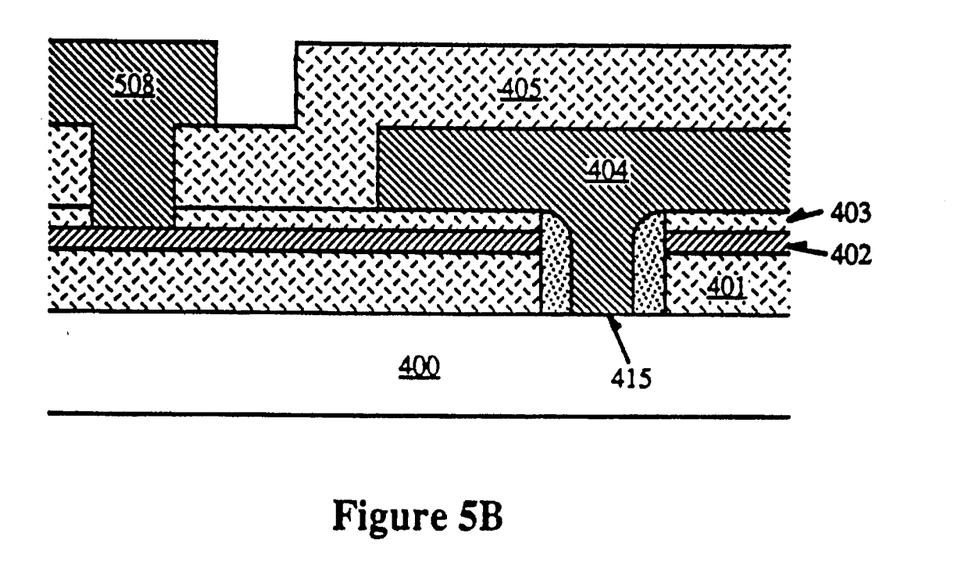

FIGS. 5A and 5B illustrate a method of coupling the lower capacitor plate 402 of the structure shown in FIG. 4 to ground. FIG. 5A shows a region where power distribution level 404 is not present over layer 402. That is, insulative layer 405 is deposited directly on insulative layer 403, as shown in the left hand side of FIG. 5A. After deposition of insulative layer 405, a patterning layer having an opening which exposes the surface of insulative layer 405 in the region which will become via 512, is formed. Next, an etch is performed through layers 405, and 403 to form via 512, exposing capacitor plate 402. Next, a conductive layer is deposited and patterned to form connection 508 to ground, as shown in FIG. 5B. As with layer 108 of FIG. 1E, connection of plate 402 to ground through layer 508 is typically done concurrently with preexisting interconnection processing. The connection to ground may require an additional processing step, or may be part of normal processing for interconnection layer 508.

The specific methods of connection to power and ground or specific process sequences described are not necessarily limited to the embodiment in which they are shown. That is, any one or more of the methods for connection to power and ground described herein, as well as similar methods which will be apparent to one skilled in the art upon reading this disclosure, can be utilized to couple both the upper and lower capacitor plates of any embodiment of the present invention to power and ground, and these methods of connection are not limited to the particular embodiment in which they are described.

Thus, a novel decoupling capacitor is disclosed. The capacitor of the present invention is placed directly on the substrate for which the capacitor serves as a decoupling capacitor. In the present invention, no extra masking steps are required to form the disclosed capacitor. An isolated via fabricated with a single masking step is also disclosed. Further, several methods of coupling the upper and lower plates to power and ground are disclosed. A maximum of only two additional masking steps are required, as opposed to prior art methodologies requiring four masking steps. While the present invention has been described with reference to specific embodiments thereof, many variations of the present invention will be obvious to one skilled in the art and are considered to be within the scope and spirit of the present invention.

What is claimed is:

1. A capacitor comprising:
    a first insulative layer disposed on a substrate, said substrate comprising electronic circuitry;
    a first conductive layer disposed on said first insulative layer;
    a second insulative layer disposed on said first conductive layer;
    a second conductive layer disposed on said second insulative layer;
    a third insulative layer disposed on said second conductive layer, wherein one of said first and said second conductive layers is coupled to a power source and wherein said first conductive layer and said second conductive layer provide capacitance for said electronic circuitry; and
    an opening extending through said first insulative layer, said first conductive layer and said second insulative layer, said opening having a sidewall, said sidewall having a sidewall insulator disposed thereon.

2. The capacitor as described in claim 1 wherein said one of said first and said second conductive layers coupled to said power source comprises a power distribution level.

3. The capacitor as described in claim 1 wherein said opening exposes a portion of said substrate, said opening has a conductive material therein, and said conductive material is coupled to said portion of said substrate.

4. The capacitor as described in claim 2 wherein said opening exposes a portion of said substrate, said opening has a conductive material therein, and said conductive material is coupled to said portion of said substrate.

5. The capacitor as described in claim 3, wherein said conductive material couples said second conductive layer to said portion of said substrate, said portion of said substrate being further coupled to one of a power supply and a ground.

6. The capacitor as described in claim 4, wherein said second conductive layer comprises said power distribution level, and wherein said conductive material couples said second conductive layer to said portion of said substrate.

7. The capacitor as described in claim 1 wherein said opening extends through said second conductive layer and said third insulative layer, said opening exposes a portion of said substrate, said opening has a conductive material therein, and said conductive material is coupled to said portion of said substrate.

8. The capacitor as described in claim 7 wherein an upper level conductive layer is coupled to said conductive material, so that said upper level conductive layer is coupled to said portion of said substrate.

9. The capacitor as described in claim 8 wherein said upper level conductive layer comprises said conductive material.

10. The capacitor as described in claim 8 wherein said upper level conductive layer comprises an interconnection line.

11. The capacitor as described in claim 8 wherein said upper level conductive layer is further coupled to one of said first and said second conductive layers, and wherein said portion of said substrate is coupled to one of a power supply and ground.

12. The capacitor as described in claim 1 wherein said first dielectric layer has an opening therein, said opening exposing a portion of said substrate, wherein said first conductive layer is coupled to said portion of said substrate in said opening.

13. The capacitor as described in claim 12 wherein said portion of said substrate is coupled to one of a power supply and ground.

14. A decoupling capacitor formed on a substrate, comprising:
    a first insulative layer formed on the substrate;
    a first conductive layer formed on said first insulative layer;
    a second insulative layer formed on said first conductive layer;
    a second conductive layer formed on said second insulative layer;
    a third insulative layer formed on said second conductive layer, wherein said first conductive layer and said second conductive layer provide capacitance;
    an opening extending through said first insulative layer, said first conductive layer and said second insulative layer, said opening having a sidewall, said sidewall having a sidewall insulator formed thereon.

15. The capacitor as described in claim 14 wherein one of said first and said second conductive layers is coupled to a power source.

16. The capacitor as described in claim 15 wherein said one of said first and said second conductive layers coupled to said power source comprises a power distribution level.

17. The capacitor as described in claim 14, wherein said opening exposes a portion of said substrate, said opening has a conductive material therein, and said conductive material is coupled to said portion of substrate.

18. The capacitor as described in claim 17, wherein said conductive material couples said second conductive layer to said portion of said substrate, said portion of said substrate being further coupled to one of a power supply and a ground.

19. The capacitor as described in claim 17, wherein said second conductive layer comprises said power distribution level, and wherein said conductive material couples said second conductive layer to said portion of said substrate.

20. The capacitor as described in claim 14, wherein said opening extends through said second conductive layer and said third insulative layer, said opening exposes a portion of said substrate, said opening has a conductive material therein, and said conductive material is coupled to said portion of said substrate.

21. The capacitor as described in claim 20 wherein an upper level conductive layer is coupled to said conductive material.

22. The capacitor as described by claim 21 wherein said upper level conductive layer comprises said conductive material.

23. The capacitor as described in claim 21 wherein said upper level conductive layer comprises an interconnection line.

24. The capacitor as described in claim 21 wherein said upper level conductive layer is further coupled to one of said first and said second conductive layers, and wherein said portion of said substrate is coupled one of a power supply and ground.

* * * * *